United States Patent [19]

Lach

[11] Patent Number: 4,789,798

[45] Date of Patent: Dec. 6, 1988

[54] ECL TO GAAS LOGIC CONVERSION CIRCUIT WITH POSITIVE FEEDBACK

[75] Inventor: Lawrence E. Lach, Chicago, Ill.

[73] Assignee: Gould Inc., Rolling Meadows, Ill.

[21] Appl. No.: 923,539

[22] Filed: Oct. 27, 1986

Related U.S. Application Data

[63] Continuation-in-part of Ser. No. 785,298, Oct. 7, 1985.

[51] Int. Cl.⁴ ............... H03K 19/092; H03K 19/094; H03K 3/29
[52] U.S. Cl. .................................. 307/475; 307/450; 307/554; 307/574; 307/290
[58] Field of Search ............... 307/279, 446, 290, 574, 307/475, 450, 554, 558

[56] References Cited

U.S. PATENT DOCUMENTS 4,150,308  4/1979  Adlhoch .......................... 307/475
4,375,677  3/1983  Schuermeyer .................... 307/279

FOREIGN PATENT DOCUMENTS 0211027  6/1984  Fed. Rep. of Germany ...... 307/443

*Primary Examiner*—John S. Heyman
*Assistant Examiner*—M. R. Wambach
*Attorney, Agent, or Firm*—R. J. Fox; G. P. Edgell; E. E. Sachs

[57] ABSTRACT

A gallium arsenide device converts an ECL voltage signal to a gallium arsenide voltage signal. The device has a pair of depletion transistors for transforming the ECL voltage signal and a predetermined reference voltage into corresponding signal and reference currents to provide pull-up. A pair of enhancement transistors are connected to the pair of depletion transistor for outputting the gallium arsenide voltage signal which is representative of the ECL voltage signal. Positive feedback means for increasing the gain of the pair of enhancement transistors is provided and is connected to the pair of enhancement transistors. The predetermined reference voltage may be derived from a set voltage source or may be derived from a logical one level in the ECL circuit so as to provide temperature tracking for the gallium arsenide circuit. At least a third depletion transistor is connected to a third enhancement transistor. The third enhancement transistor has a gate connected to the output of the pair of depletion transistors. The third depletion and enhancement transistors have a substantially similar structure and topology to the pair of depletion and enhancement transistors.

7 Claims, 3 Drawing Sheets

ECL TO GAAS LOGIC CONVERSION CIRCUIT WITH POSITIVE FEEDBACK

CROSS-REFERENCE TO RELATED APPLICATION

This is a continuation-in-part of application Ser. No. 785,298 filed Oct. 7, 1985.

BACKGROUND OF THE INVENTION

The present invention relates in general to digital logic conversion circuits having metal semiconductor field effect transistor (MESFET) devices and, in particular, to conversion circuits for converting digital signals from emitter coupled logic (ECL) voltage levels to gallium arsenide (GaAs) voltage levels.

As the use of gallium arsenide devices increases in digital logic circuits, there is a need for a method of providing compatible voltage levels between the new gallium arsenide circuits and digital logic circuits used in older forms of circuitry such as ECL. Circuits for converting digital logic ECL signals to digital logic GaAs signals are known in the prior art but usually involve extensive inner relationship of the gallium arsenide devices to the emitter coupled devices and add substantially to the number of components in the logic circuits.

The present invention has the advantage of converting ECL to gallium arsenide signals with a minimum of interconnection between the different types of circuitry and with a minimum number of components. Furthermore, the gallium arsenide circuit offers a substantial amount of immunity to temperature and process variables. There is a further advantage of the present invention in that the conversion circuit may offer a useful amount of switching hysteresis during the conversions, minimizing the effect of random noise on the signal lines.

Although the present invention relates to gallium arsenide devices, the invention can also be used with other semiconductor technologies which support MESFET transistor structures. For example, technologies using InP devices. U.S. Pat. No. 4,150,308 issued to Adlhoch and U.S. Pat. No. 4,375,677 issued to Schuermeyer are representative of prior art in this field. Adlhoch teaches that in silicon IGFET technology it is possible to define circuits containing cross-coupled pairs of both p-channel and n-channel devices to achieve conversion between one set of signal levels and another. Schuermeyer teaches that in digital GaAs MESFET technology it is possible to define a capacitively cross-coupled circuit for dynamic random access memory applications. Other variations of cross-coupled static random access memory circuits can also be found in prior silicon and GaAs art. Nevertheless, what is not appreciated or anticipated by the prior art is a central concept of this invention, viz., the remarkable utility in defining an ECL/GaAs input circuit with a circuit topology having a substantial degree of structural similarity to the GaAs logic on the same die. Specifically, by this technique, not only is it possible to achieve compatibility of signal levels between the input circuit and the logic for a given process, but because of the intentional high degree of structural similarity of the circuits, this compatibility is automatically maintained over a substantially wider range of process and temperature variations than by conventional methods. The maintenance of this compatibility is a significant factor in increasing the overall process yield of the digital GaAs die, thereby producing a significantly more profitable product.

SUMMARY OF THE INVENTION

The present invention involves a gallium arsenide device for converting an ECL voltage signal to a gallium arsenide voltage signal. The device has a pair of depletion transistors means for transforming the ECL voltage signal and a predetermined reference voltage into corresponding signal and reference currents to provide pull-up. A pair of enhancement transistor means is operatively connected to the pair of depletion transistor means for outputting the gallium arsenide voltage signal which is representative of the ECL voltage signal. Positive feedback means for increasing the gain of the pair of enhancement transistor means is provided and is operatively connected to the pair of enhancement transistor means. The predetermined reference voltage may be derived from a set voltage source or may be derived from a logical one level in the ECL circuit so as to provide temperature tracking for the gallium arsenide circuit. At least a third load element means is connected to a third driver element means. The third driver element means has an input connected to the output of the pair of load element means. The third load and driver element means has a substantially similar structure and topology to the pair of load and driver element means.

BRIEF DESCRIPTION OF THE DRAWINGS

The features of the present invention which are believed to be novel are set forth with particularity in the appended claims. The invention together with the further objects and advantages may best be understood by reference to the following description taken in conjunction with the accompanying drawings, in the several figures in which like reference numerals identify like elements, and in which:

FIG. 5 is a diagram of output voltage versus input voltage for the FIG. 4 circuit.

DESCRIPTION OF THE PREFERRED EMBODIMENT

Figure 1:
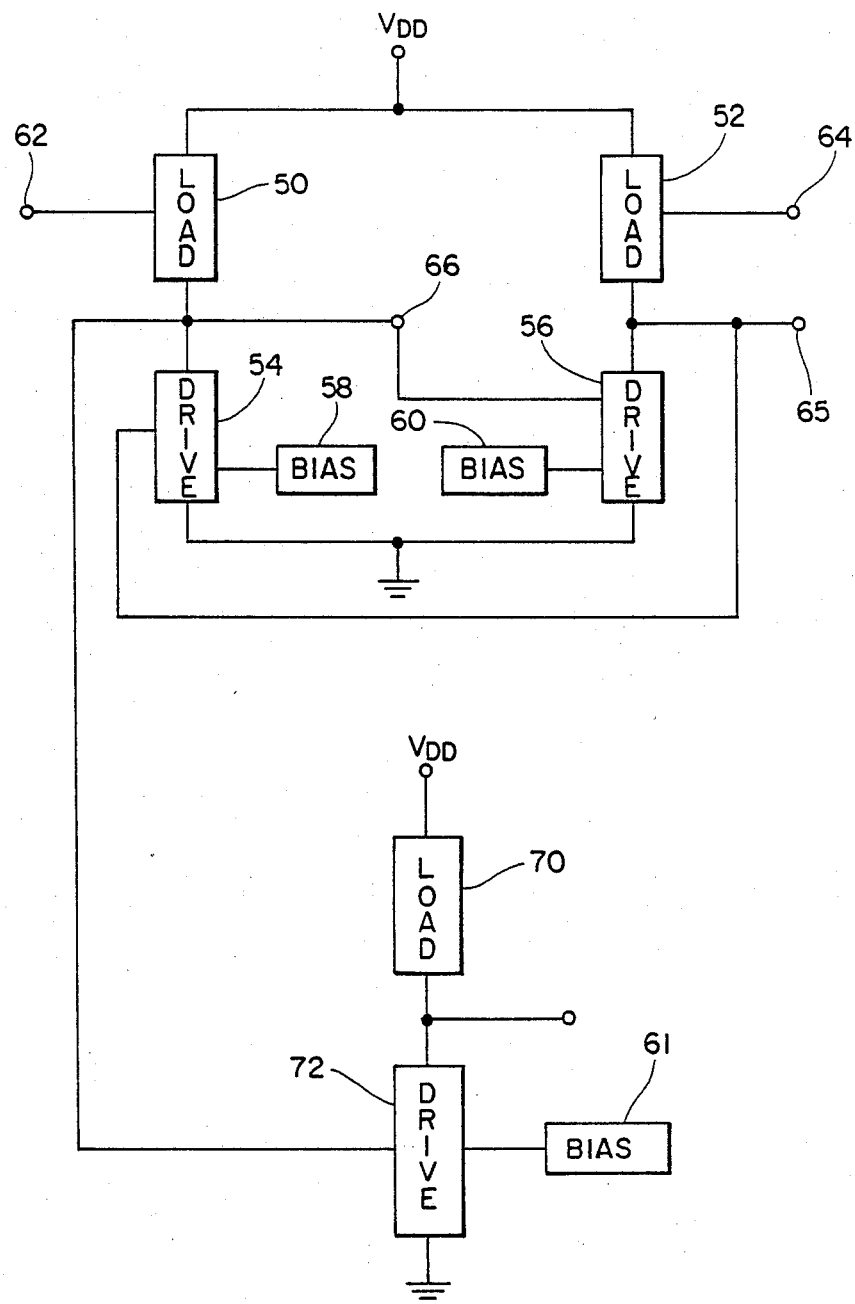
FIG. 1 is a general block diagram of the present invention.

In general terms, as shown in FIG. 1, the present invention has a pair of load elements 50 and 52 for providing pull up operatively connected to a pair of driver elements 54 and 56 for providing pull down. These elements utilize MESFET transistor structures and can be structured for use with a variety of logic families. Depending upon the type of logic family chosen, the biasing 58, 60 and 61 is selected to define cutoff and the associated logic state.

Load element 50 receives an ECL input signal on input terminal 62 and a reference voltage is applied to terminal 64 for load element 52. The input to driver element 56 is an output signal from load element 50 and driver element 54 at output terminal 66, and the input to driver element 54 is an output signal from load element 52 and driver element 56 at output terminal 65. Thus, the circuit has positive feedback which provides the necessary circuit gain.

An important feature of the present circuit is its structural symmetry. Because of the symmetry, compatibility between this circuit and the circuitry producing the ECL signal is maximized for process and temperature variations.

Another important feature of the present circuit is its potential structural similarity to the GaAs logic which it drives. Because of this potential structural similarity, compatibility between this circuit and the GaAs logic can be maximized despite process and temperature variations.

Specifically, the structural similarity applies to load element 70 connected to driver element 72. An input to driver element 72 is connected to the output 66 as shown in FIG. 1. Typically, load element 70 and driver element 72 are part of the next logic gate.

Figure 2:
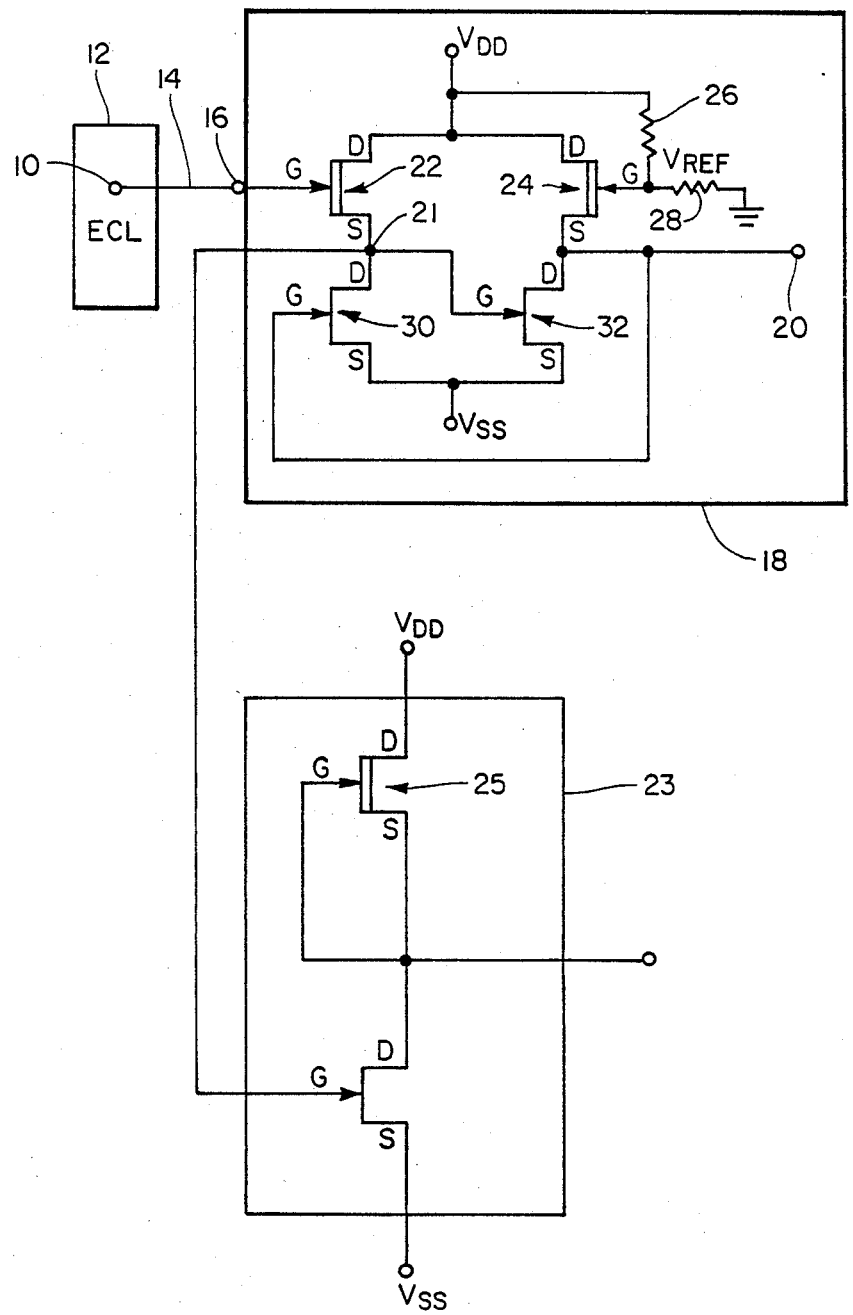
FIG. 2 is a schematic diagram of a circuit embodying the present invention.

FIG. 2 illustrates a particular case of FIG. 1 and depicts the logic conversion process wherein a logical voltage level which appears on terminal 10 in the ECL logic shown as block 12 is carried on line 14 to the input terminal 16 of the gallium arsenide circuitry 18. The gallium arsenide circuitry in block 18 converts the ECL voltage signal appearing at input 16 to gallium arsenide voltage signals which appear on the output terminals 20 and 21. The gallium arsenide voltage signals are representative of the ECL voltage signal.

As shown in FIG. 2, first and second depletion transistors 22 and 24 have their drains operatively connected to the first predetermined voltage source $V_{DD}$. The first depletion transistor 22 has its gate receiving the ECL voltage signal from input terminal 16 and the second depletion transistor 24 has its gate operatively connected to a predetermined reference voltage. The reference voltage is shown as being obtained from the first predetermined voltage source $V_{DD}$ by a resistor divider network composed of resistors 26 and 28. First and second enhancement transistors 30 and 32 have their sources operatively connected to a second predetermined voltage source $V_{SS}$. The first enhancement transistor 30 has its drain operatively connected to a source of the first depletion transistor 22. The second enhancement transistor 32 has its gate operatively connected to the source of the first depletion transistor 22. The second enhancement transistor 32 has its drain operatively connected to a source of the second depletion transistor 24 and to a gate of the first enhancement transistor 30. A signal which may optionally be used as an output appears on the output terminal 20 and is used for positive feedback in the circuit. A gallium arsenide signal of opposite phase also appears on the output terminal 21.

The next logic gate 23 has at least a third depletion transistor 25 having its drain connected to the first predetermined voltage source $V_{DD}$ and having its gate connected to its source. A third enhancement transistor has its drain connected to the source of the third depletion transistor 25, its source connected to the second predetermined voltage source $V_{SS}$ and its gate connected to the output terminal 21.

It is to be understood that other logic gate configurations may be used, as long as, the logic gate configuration possess load and driver means featuring a substantially similar structure and topology to the load and driver means in the circuit 18.

Figure 3:
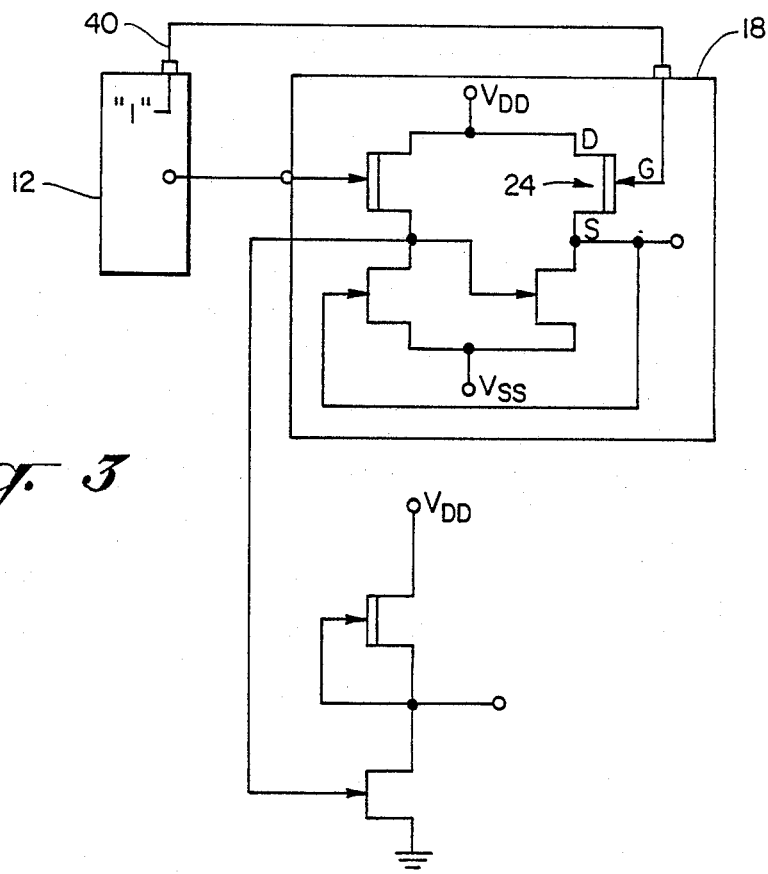
FIG. 3 is an alternative embodiment of the present invention in a circuit utilizing the logical one level of the ECL circuitry for a reference voltage.

FIG. 3 shows an alternative embodiment wherein a logical one voltage level in the ECL circuitry 12 is outputted along line 40 to provide the predetermined reference voltage for the gallium arsenide circuitry 18. The signal appearing on line 40 is operatively connected to the gate of the second depletion transistor 24 and thereby provides a tracking ability as levels in the logical one voltage change in the ECL circuitry 12.

Figure 4:
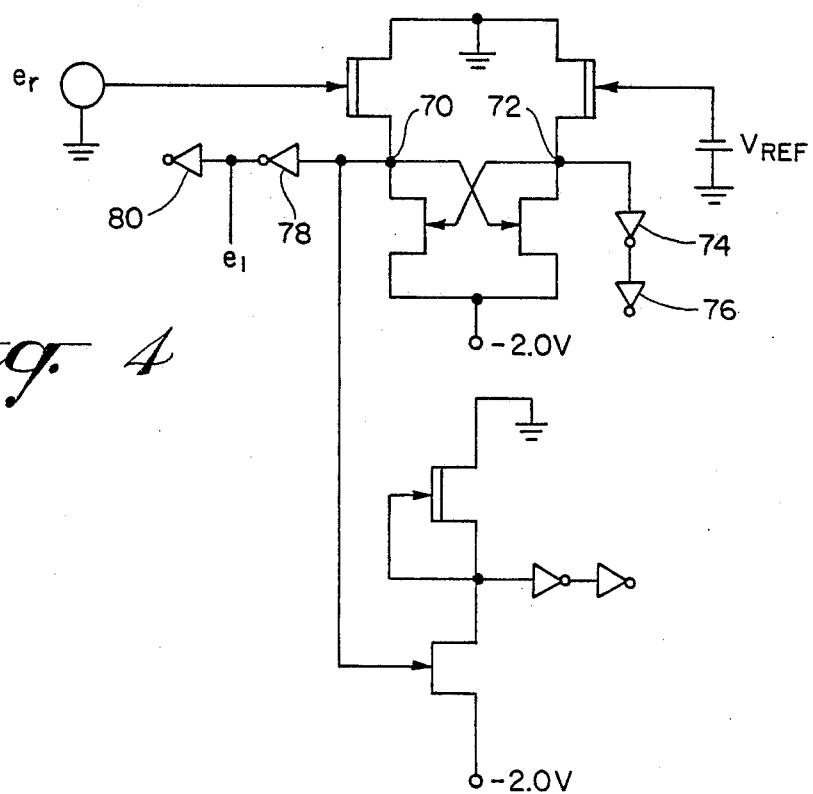
FIG. 4 is a schematic diagram of the FIG. 2 circuit used in a computer model simulation.

FIG. 4 shows a test circuit which was simulated to study the operating charcteristics of the gallium arsenide ECL to GaAs conversion. FIG. 5 is a graph of the simulated output voltage versus the input voltage for the FIG. 4 circuit. These results were obtained using model parameters from an early stage of development of an enhancement/depletion GaAs process. Detailed features of simulation results can vary depending upon the values of the simulation model parameters.

As shown in FIG. 4 an ECL logic signal, $e_r$, was inputted to the test circuit. The ECL logic signal has a logical low, ECL "0", of approximately $-1.8$ volts and a logical high, ECL "1", of approximately $-0.8$ volts. The simulated GaAs logic signal outputted from the test circuit was approximately $-1.4$ volts, GAAS "1", when the ECL logic signal was low and approximately $-1.8$ volts, GAAS "0" when the ECL logic signal was high. The graph in FIG. 5 shows the GaAs output voltage, $e_i$, as a function of the ECL input voltage, $e_r$.

When the ECL logic signal, $e_r$, is low, node 70 is low and node 72 is high and vice versa when the ECL logic signal, $e_r$, is high. In the test circuit inverters 74 and 76 are connected to node 72 to provide balance to inverters 78 and 80 connected to node 70.

The invention is not limited to the particular details of the apparatus depicted and as other modifications and applications are contemplated certain other changes may be made in the above described apparatus without departing from the true spirit and scope of the invention herein involved. It is intended therefore that the subject matter in the above depiction shall be interpreted as illustrative and not in a limiting sense.

What is claimed is:

1. A MESFET device for converting an ECL voltage signal to a predetermined voltage signal, comprising:

a pair of load element means for transforming an ECL voltage signal and a predetermined reference voltage into a corresponding signal current and a corresponding reference current to provide pull up;

a pair of driver element means connected to said pair of load element means for outputting a predetermined voltage signal representation of the ECL voltage signal at a first output node;

positive feedback means connected to said first output node and to one of said pair of driver element means for increasing a gain of said pair of driver element means;

a third load element means having an input connected to said first output node of said pair of load element means;

wherein said third load element means and said third driver element means have a substantially similar structure and topology to said pair of load element means and driver element means and wherein said predetermined reference voltage is derived from a signal source which supplies an ECL logical one level signal, said signal source being associated with a circuit supplying the ECL voltage signal such that said predetermined reference voltage tracks any voltage level changes in said ECL logic one level signal.

2. A MESFET device for converting an ECL voltage signal to a predetermined voltage signal as defined in claim 1, wherein said predetermined reference voltage is derived from a resistive voltage divider network coupled to a first predetermined voltage source.

3. A gallium arsenide device for converting an ECL voltage signal to a gallium arsenide voltage signal, comprising:
   means for transforming the ECL voltage signal and a predetermined reference voltage into a corresponding signal and a reference current to provide pull up including a pair of gallium arsenide depletion mode field effect transistors;
   means for outputting the gallium arsenide voltage signal representation of the ECL voltage signal including a pair of gallium arsenide enhancement mode field effect transistors connected to said pair of gallium arsenide depletion mode field effect transistors;
   positive feedback means for increasing the gain of said pair of gallium arsenide enhancement mode field effect transistors and connected to said pair of gallium arsenide enhancement mode field effect transistor means;
   at least a third gallium arsenide depletion mode field effect transistor connected to a third gallium arsenide enhancement mode field effect transistor, said third gallium arsenide enhancement mode field effect transistor having a gate connected to an output of said pair of gallium arsenide depletion mode field effect transistors;
   wherein said third gallium arsenide depletion mode field effect transistor and said third gallium arsenide enhancement mode field effect transistor have a substantially similar structure and topology to said pair of gallium arsenide depletion mode and gallium arsenide enhancement mode transistors.

4. A gallium arsenide device for converting an ECL voltage signal to a gallium arsenide voltage signal as defined in claim 3, wherein said predetermined reference voltage is supplied by a resistive voltage divider network connected to a first predetermined voltage source.

5. A gallium arsenide device for converting an ECL signal to a gallium arsenide signal, comprising:
   a first gallium arsenide depletion mode field effect transistor and a second gallium arsenide depletion mode field effect transistor, each having a respective gate, source and drain and having their drains connected to a first predetermined voltage source, said first gallium arsenide depletion mode field effect transistor having its gate coupled for receiving the ECL signal and said second gallium arsenide depletion mode field effect transistor having its gate connected to receive a predetermined reference voltage;
   a first gallium arsenide enhancement mode field effect transistor and a second gallium arsenide enhancement mode field effect transistor, each having a respective gate, source and drain and having their sources connected to a second predetermined voltage source, said first gallium arsenide enhancement mode field effect transistor having its drain connected to said source of said first gallium arsenide depletion mode field effect transistor, said second gallium arsenide enhancement mode field effect transistor having its gate connected to said source of said first gallium arsenide depletion mode field effect transistor and said second gallium arsenide enhancement mode field effect transistor having its drain connected to said source of said second gallium arsenide depletion mode field effect transistor and to said gate of said first gallium arsenide enhancement mode field effect transistor, the gallium arsenide signal appearing on said drain of said first gallium arsenide enhancement mode field effect transistor;
   a third gallium arsenide depletion mode field effect transistor having a gate, a source and a drain, having its gate connected to its source, is drain connected to said first predetermined voltage source and having a structure similar to said first gallium arsenide depletion mode field effect transistor and said second gallium arsenide depletion mode field effect transistor; and
   a third gallium arsenide enhancement mode field effect transistor having a gate, a source and a drain and having its drain connected to said source of said third gallium arsenide depletion mode field effect transistor, haing its source connected to said second predetermined voltage source and having its gate connected to said drain of said first gallium arsenide enhancement mode field effect transistor and having a structure similar to said first gallium arsenide depletion mode field effect transistor and said second gallium arsenide depletion mode field effect transistor;
   wherein said third depletion and enhancement transistors have a substantially similar structure to said first and second of depletion and enhancement transistors.

6. A gallium arsenide device for converting an ECL voltage signal to a gallium arsenide voltage signal as defined in claim 5, wherein said predetermined reference voltage is derived from a signal source which supplies an ECL logic on level signal, said signal source being associated with a circuit supplying the ECL voltage signal, such that said predetermined reference voltage tracks level changes in said ECL logic one level signal.

7. A gallium arsenide device for converting an ECL voltage signal to a gallium arsenide voltage signal as defined in claim 6, wherein said predetermined reference voltage is derived from a resistive voltage divider network connected to said first predetermined voltage source.

* * * * *